United States Patent [19]

Hoshino

[11] Patent Number: 4,613,401
[45] Date of Patent: Sep. 23, 1986

[54] METHOD FOR DRY ETCHING A CHROMIUM OR CHROMIUM OXIDE FILM

[75] Inventor: Eiichi Hoshino, Tokyo, Japan

[73] Assignee: Fujitsu Limited, Kawasaki, Japan

[21] Appl. No.: 767,575

[22] Filed: Aug. 20, 1985

[30] Foreign Application Priority Data

Aug. 24, 1984 [JP] Japan ................ 59-175070

[51] Int. Cl.$^4$ .............. C23F 1/02; B44C 1/22; C03C 15/00; C03C 25/06
[52] U.S. Cl. .................. 156/643; 156/646; 156/656; 156/659.1; 156/664; 156/667; 156/345; 204/192.32; 252/79.1
[58] Field of Search ............ 156/643, 646, 656, 659.1, 156/664, 667, 345; 252/79.1; 204/192 E; 427/38, 39; 430/313, 317, 318

[56] References Cited

U.S. PATENT DOCUMENTS

| | | | |
|---|---|---|---|
| 3,951,709 | 2/1974 | Jacob | 156/643 |
| 4,445,966 | 5/1984 | Carlson et al. | 156/643 |

FOREIGN PATENT DOCUMENTS 57-76188  8/1982  Japan .
58-19476  4/1983  Japan .
58-110674 9/1983  Japan .

Primary Examiner—William A. Powell
Attorney, Agent, or Firm—Armstrong, Nikaido, Marmelstein & Kubovcik

[57] ABSTRACT

The dry etching rate of a Cr film has been increased by adding ethyl or methyl alcohol vapor to an etchant gas containing a halide of a hydrocarbon such as $CCl_4$ and oxygen gas. The dry etching rate increase is attributed to the reduction reaction of a dry etching product, $CrO_2Cl_2$, into chemically stable $CrCl_3$, the reduction reaction suppresses deposition of Cr generated by the decomposition of chemically unstable $CrO_2Cl_2$.

8 Claims, 3 Drawing Figures

METHOD FOR DRY ETCHING A CHROMIUM OR CHROMIUM OXIDE FILM

BACKGROUND OF THE INVENTION

This invention relates to a method for dry-etching a chromium (Cr) or chromium oxide film, and particularly relates to an etchant gas used in the method for dry etching the film.

Cr thin film is a material which is indispensable for producing the masks used for generating precision patterns in IC chips. Such Cr film is generally subjected to a photo-lithographic process. Recently an electron-beam lithographic process has been used in the place of a photo-lithographic process. Also, it is conventional to selectively etch off using a wet process for developing the final pattern. However, dry etching processes are beginning to be employed instead of the wet process, in order to provide finer patterns and to simplify the etching process of the Cr films.

In the dry etching of Cr film, an etchant gas containing a halide of hydrocarbon, for example, $CCl_4$, and oxygen is generally used. The etching mechanism involved in the dry etching is considered to be very complicated, but it is believed that the dominant process is a kind of reactive sputtering. The Cr or Cr-oxide film is removed by forming a chromyl halide having a relatively high vapor pressure, such as chromyl chloride ($CrO_2Cl_2$) through a chemical reaction with a halogen-containing etchant gas, such as $CCl_4$, accompanied by oxygen gas. A chemical reaction between the Cr film and the etchant gas may be illustrated by following:

$$2Cr + CCl_4 + 3O_2 b = 2CrO_2Cl_2 + CO_2 \tag{1}$$

However, $CrO_2Cl_2$ is an unstable compound so the reverse reaction, toward left side in the above equation, can not be neglected. As a result, Cr atoms, released by the decomposition, deposit on the Cr film to be etched. Therefore, the etching rate data for a Cr film is usually small as compared to data relating to other materials such as silicon. As mentioned above the dry etching mechanism is complicated, accordingly the rate of the reverse reaction forming Cr atoms through the decomposition of $CrO_2Cl_2$ seems to fluctuate depending upon the reaction conditions. Therefore, extremely precise control of the reaction conditions is required in order to obtain reproducible results relating to the etching rate of the Cr film. The factors which must be controlled in this regard include, among other factors, the partial pressures and flow rates of the respective constituents in the etchant gas, input power for the generating plasma of the etchant gas, and the exhausting velocity of the pumping system in the dry etching system. However, there are further unknown factors which tend to decrease reproducibility.

As described above, the etching rate of a resist film is generally higher than the etching rate of Cr to the etchant gas. Because of this, a resist mask film of a relatively larger thickness is needed for patterning the Cr film. The low etching rate of Cr film results in a long etching time and causes pattern deformation in the masking resist film due to a temperature rise during the etching period. Further, the necessarily large thickness of the resist film inevitably leads to a poor accuracy in the pattern formed in the resist film. These problems are particularly critical in resist films which are sensitive to electron beam exposure, because their chemical and physical stability in dry etching circumference are low compared with photo-sensitive resist film.

SUMMARY OF THE INVENTION

It is an object of the present invention to provide a dry etching method having a higher etching rate for a Cr or Cr-oxide film.

It is another object of the present invention of provide a dry etching method having improved reproducibility for a Cr or Cr-oxide film.

It is still another object of the present invention to provide a dry etching method which may be suitably conducted when a resist film sensitive to electron beam exposure is used for masking a Cr or Cr-oxide film.

The above objects can be attained by adding an alcohol vapor to an etchant gas containing a halide of hydrocarbon vapor and oxygen gas for dry etching of a Cr or Cr-oxide film.

Other features and advantages of the present invention will become apparent from reading the following description and claims taken in connection with the accompanying drawing, forming a part of this application, in which:

DESCRIPTION OF PREFERRED EMBODIMENTS

According to equation (1), the inventor noted that the etching rate of Cr film can be increased if the reaction product of $CrO_2Cl_2$ or $CO_2$ is removed from the chemical reaction system soon after it is formed. Also, ethyl alcohol or ethanol ($C_2H_5OH$) vapor was added as a reducing agent for $CrO_2Cl_2$ to an etchant gas atmosphere containing $CCl_4$ vapor and oxygen gas. The results showed a drastic effect caused by the addition of ethyl alcohol as described in the following.

Figure 1:
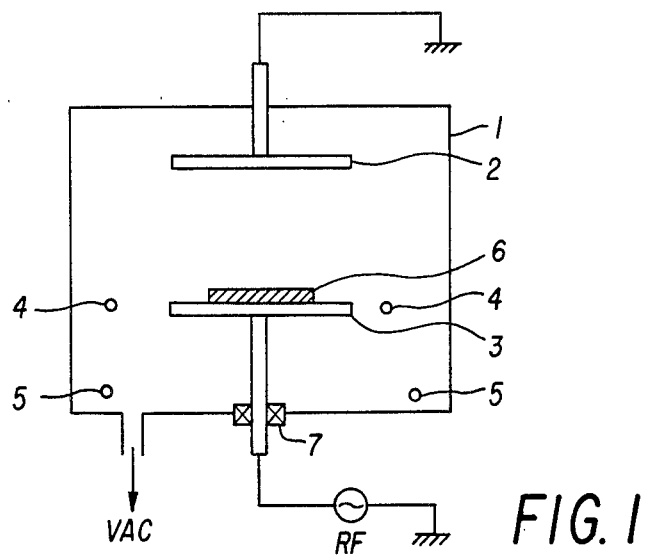
FIG. 1 is a cross-section of the reaction chamber in the dry etching system used for embodying the present invention.

FIG. 1 is a cross-section of the reaction chamber in the dry etching system used for embodying the present invention. In the reaction chamber 1, a pair of parallel electrodes comprising an anode 2 and a cathode 3, are installed, along with an etchant gas inlet pipe 4 and another inlet pipe 5 for introducing an additive component such as ethyl alcohol vapor. The cathode 3 is electrically insulated from the reaction chamber 1 by a ceramic or fluorocarbon plastic insulating material 7. On the cathode 3 there is placed a substrate 6 having a Cr film which is coated with a resistive film. The resist film has been selectively exposed to an electron beam for delineating a predetermined pattern thereon and then subjected to a developing process to remove the resist film on the portion of the Cr film which is to be etched off be subsequent dry etching. In FIG. 1. RF and VAC indicate a radio frequency power source and a vacuum exhausting system, respectively.

During the dry etching process, an etchanr gas and alcohol vapor are respectively introduced into the reaction chamber 1 from the inlet pipes 4 and 5 at respective predetermined flow rates. The pressure in the reaction chamber 1 is kept at a predetermined value by controlling the exhausting velocity of the vacuum system. A discharge of the etchanr gas is caused between the anode 2 and cathode 3 by the radio frequency power, and a plasma of the etchant gas is generated. Thus, the naked portion of the Cr film on the substrate 6 is exposed to the plasma, and it is dry etched according to the chemical reaction as expressed by equation (1).

Figure 2:
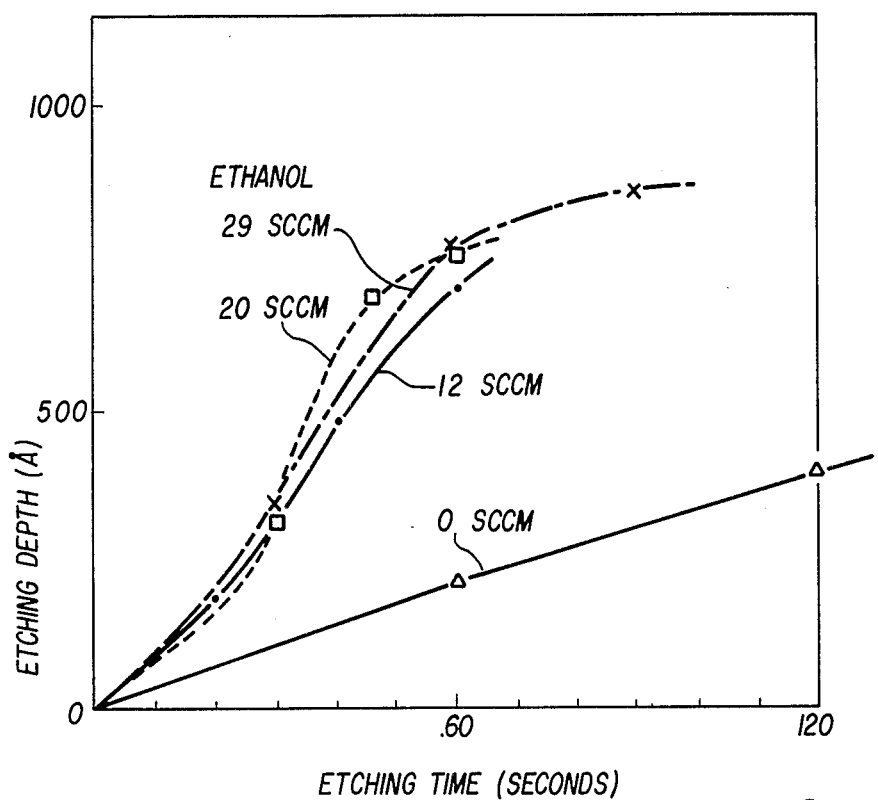
FIG. 2 is a graph showing the relation between etched depth in a Cr film and etching time in the case of the addition of ethyl alcohol vapor to an etchant gas.

FIG. 2 is a graph showing the relation between etched depth in a Cr film and the etching time under conditions where there is an addition of ethyl alcohol vapor to an etchant gas containing $CCl_4$ and oxygen. Such a relation is observed at several flow rates of ethyl alcohol vapor added to the dry etching atmosphere. Experimental conditions established for obtaining the curves in FIG. 2 are as follows:

| Cr film thickness: | 1000Å |
| --- | --- |
| Etchant gas mixture and flow rate: | $CCl_4$ 19 SCCM* |
| | $O_2$ 60 SCCM* |
| Total pressure: | 0.3 Torr |
| Input radio frequency and power: | 13.56 MHz, 75 w |
| Anode-cathode distance: | 40 mm |
| Substrate temperature: | 10° C. |

*SCCM: standard cubic centimeter per minute
The etched depth measurement of the Cr film was carried out by means of a tracer method using a contacting stylus (Alpha-STEP 200, Tencor Inc. U.S.A.)

As shown in FIG. 2, the dry etched depth increase in a Cr film is constant during etching times of up to 120 minutes when there is no addition of ethyl alcohol vapor to the etchant gas atmosphere. An average etching rate of about 190 Å/min is observed. On the other hand, a larger dry etched depth increased is observed when there is addition of ethyl alcohol vapor at flow rates of 12, 20 and 29 SCCM. The corresponding etching rate for the addition of ethyl alcohol at a 12 SCCM flow rate is about 695 Å/min in average. The addition of ethyl alcohol at a flow rate in the range from 20 to 29 SCCM shows a further increased etching rate together with a kind of induction period occurring prior to the steep increase in the rate as shown in FIG. 2. The saturation tendency of the curves for 20 SCCM and 29 SCCM is due to the final stage of the dry etching of the Cr film, wherein it has been observed that the surface of the substrate begins to be exposed.

According to the above experiment, the etching rate of Cr film can be increased approximately three times by adding ethyl alcohol vapor at a flow rate of 12 SCCM to an etchant gas containing $CCl_4$ and oxygen. Further, as shown in FIG. 2, a larger etching rate increase is revealed, with a steep gradient in the curves, when ethyl alcohol vapor at both 20 and 29 SCCM flow rates is added. The dry etching rate increase may be larger by three times or more when compared to the rate achieved under conventional dry etching conditions. According to the above results, the time necessary to etch off a Cr film can be reduced by one third or more. Therefore, the pattern accuracy degradation due to the deformation of the resist film by the temperature rise during the dry etching process can be eliminated.

In the above embodiment, the amount of the addition of ethyl alcohol has been changed within the range of 12 to 29 SCCM because of the limitation of the flow meter. However, a preliminary experiment using a different dry etching apparatus has shown a similar dry etching rate increase caused by the addition of ethyl alcohol vapor at a smaller flow rate, such as a rate in the range of 5 to 10 SCCM. The etchant gas and other experimental conditions employed in this experiment are as follows:

| Cr film thickness: | 1400Å |
| --- | --- |
| Etchant gas mixture and flow rate: | $CCl_4$ 100 SCCM |
| | $O_2$ 70 SCCM |
| Total pressure: | 0.4 Torr |
| Input radio frequency and power: | 13.56 MHz, 500 W |

According to the above embodiment and results from preliminary experiments, it is reasonable to define the preferable amount of the ethyl alcohol additive to the etchant gas mixture on the basis of the flow rate ratio of ethyl alcohol to the etchant gas mixture, and particularly to the flow rate of the halide gas component of the etchant gas mixrure, such as $CCl_4$. This is because the total pressure of the dry etching atmosphere is the dominant factor and the flow rates of ethyl alcohol vapor and the etchanr gas mixture, to achieve an appropriate total pressure, differ largely based upon the individual dry etching apparatus employed. According to the above results, it can be said that a preferable flow ratio of ethyl alcohol vapor to the halide gas component is approximately in the range of 0.05 to 1.53. It is obvious that the present invention is not strictly limited to this range.

The dry erching rate increase caused by the addition of ethyl alcohol can be attributed to the reduction of $CrO_2Cl_2$ by ethyl alcohol according to a chemical reaction as shown below.

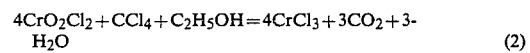

$$4CrO_2Cl_2 + CCl_4 + C_2H_5OH = 4CrCl_3 + 3CO_2 + 3\text{-}H_2O \qquad (2)$$

According equation (2) the valence value 6 of Cr in $CrO_2Cl_2$ is reduced to 3 in $CrCl_3$. This demonstrates a chemical reduction reaction by ethyl alcohol.

Equation (2) suggests that the addition of the vapor of other kinds of alcohols would be effective as a substitute for ethyl alcohol. This has been confirmed using methyl alcohol or methanol ($CH_3OH$) as described below.

Figure 3:
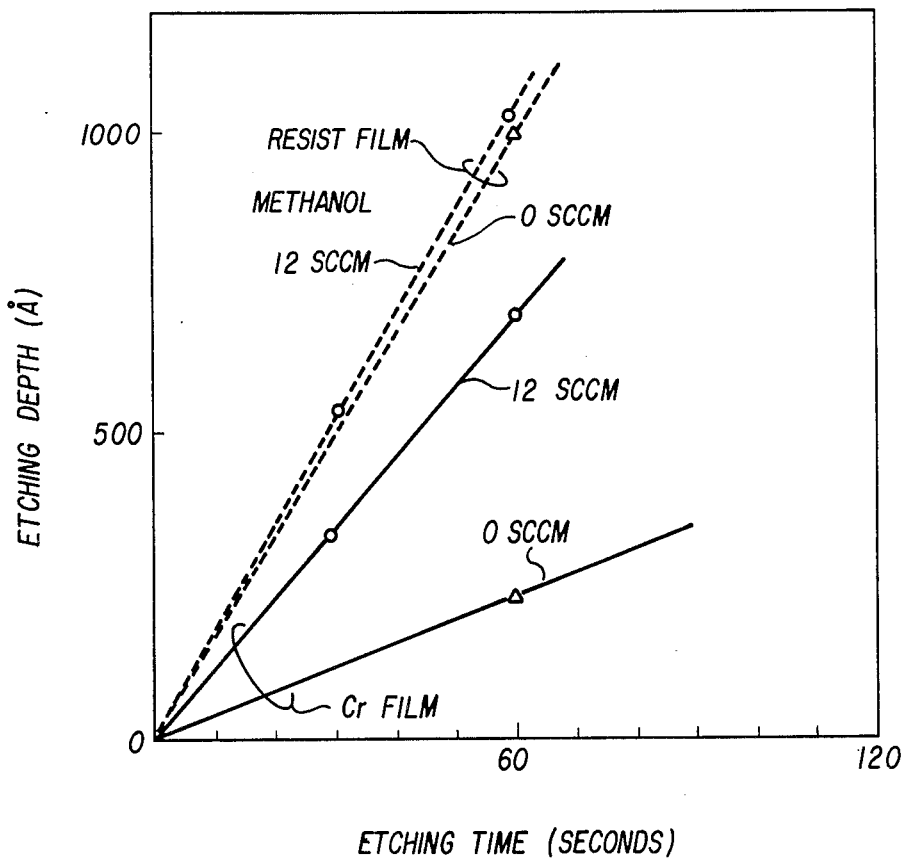
FIG. 3 is a graph showing the relation between etched depth in a Cr film and etching time in the case of the addition of methyl alcohol vapor to an etchant gas.

FIG. 3 is a graph showing the relation between etched depth in Cr film and etching time based upon the addition of methyl alcohol vapor to an etchant gas containing $CCl_4$ and oxygen. Experimental conditions established for obtaining the curves in FIG. 3 are the same as those for the curves in FIG. 2. In FIG. 3, each of the solid lines indicates the change in etched depth in Cr films as a function of etching time. Such dry etching tests have been carried out on a resist film concurrently with the Cr film and the results are plotted in broken lines in FIG. 3.

As shown in FIG. 3, the etching rate of a Cr film is increased from 230 Å/min, in the case of an etchant gas without the addition of methyl alcohol vapor, to about 690 Å/min for etchant gas with the addition of methyl alcohol vapor at flow rate of 12 SCCM. That is, the dry etching rate of a Cr film is increased three times by the addition of methyl alcohol vapor. On the other hand, the etching rate of a resist film reveals only a slight change with the addition of methyl alcohol vapor. A rate of about 1040 Å/min was observed for the etchant gas with addition of methyl alcohol vapor and a rate of about 1000 Å/min was observed for the etchant gas without the addition of methyl alcohol vapor. Accordingly, dry etching selectivity (ratio of etching rate of the Cr film to that of the resist film) is increased from 0.23, when there is no addition of methyl alcohol vapor, to 0.64 when methyl alcohol vapor is added. Such an increase in the dry etching selectivity permits a reduction in the necessary thickness of the resist film and is advantageous for increasing the accuracy of pattern generated in the Cr film. The preferable flow rate ratio for the addition of methyl alcohol vapor, can be assumed to be in the same range as the range mentioned with reference to the embodiment using the ethyl alcohol additive.

Experimental result obtained by addition of n- or iso-propyl alcohol vapor has not revealed any improvement in the dry etching rate of a Cr film. The reason for the lack of a positive effect based upon the addition of the propyl alcohols is not yet clear. However, the large cross-section of propyl alcohol molecules could cause a reduction in the life time of the halogen radicals in the plasma, and hence, decrease the apparent dry etching rate.

Many of the theories introduced into the above discussion should be regarded as tentative ones. Regardless of the theories, the dry etching method according to the present invention has been shown to produce excellent results.

As shown in FIG. 1, the inlet pipe 5 for ethyl alcohol vapor is installed apart from the inlet pipe 4 for erchant gas mixture of oxygen gas and the halide of hydrocarbon vapor. This is intended to reduce the probability of a direct reaction between oxygen gas and ethyl alcohol vapor.

A Cr-film mask used for generating patterns on IC chips by using photo-lithographic processes is usually provided with an anti-reflective film of, for example, chromium oxide, $Cr_2O_3$, having a thickness of about 200 Å. In general, the Cr-oxide film is subsequently formed on a metallic Cr film, and then, subjected to a dry etching process for generating a predetermined pattern together with the underlying Cr film. Therefore, it is obvious to those in the art that the above embodiment can be effectively applied to such a Cr-oxide film on a Cr film.

Considering the mechanism for increasing the dry etching rate of Cr film as explained with reference to equation (2), it is also obvious to those in the art that the addition of ethyl or methyl alcohol vapor can improve the dry etching rate when using an etchant gases containing one of the halides of hydrocarbons such as $CF_4$ (carbon tetrafluoride), $CH_3CCl_3$ (methyl-trichloro-methane), $C_2Cl_4$ tetrachloro-ethylene) and $C_2H_2Cl_2$ (dichloro-ethylene).

It should be understood that the specific form of the invention here and above described is intended to be representative only, as certain modifications within the scope of these teachings will be apparent to those skilled in the art of dry-etching. Accordingly, reference should be made to the following claims to determine the full scope of the invention.

What is claimed:

1. An improved method for dry etching a chromium (Cr) or Cr-oxide film in which an etchant gas is used to remove the Cr or Cr-oxide film by chemically reacting said film with the etchant gas, the improvement comprising:
    subjecting the Cr or Cr-oxide film to a plasma of a gas mixture containing the vapors of a halide of a hydrocarbon and the vapors of an alcohol selected from a group consisting of $CH_3OH$ and $C_2H_5OH$.

2. A dry etching method as set forth in claim 1, wherein said halide is chloride.

3. A dry etching method as set forth in claim 1, wherein halide is a fluoride.

4. A dry etching method as set forth in claim 2, wherein said chloride is selected from a group consisting of $CCl_4$, $C_2Cl_4$ and $C_2H_2Cl_2$.

5. A dry etching method as set forth in claim 3, wherein said fluoride is selected from a group consisting of $CF_4$.

6. A dry etching method as set forth in claim 1, wherein said halide vapor and said alcohol vapor are introduced into a chamber and said plasma is generated therein, through individual inlets.

7. A dry etching method as set forth in claim 1, wherein said Cr or Cr-oxide film is selectively masked with a resist layer.

8. A dry etching method as set forth in claim 1, wherein said gas mixture includes oxygen gas.

* * * * *